United States Patent [19]

DeFazio et al.

[11] Patent Number: 4,800,564
[45] Date of Patent: Jan. 24, 1989

[54] HIGH PERFORMANCE CLOCK SYSTEM ERROR DETECTION AND FAULT ISOLATION

[75] Inventors: John J. DeFazio, Pleasant Valley; Timothy G. McNamara, Poughkeepsie, both of N.Y.

[73] Assignee: International Business Machines Corporation, Armonk, N.Y.

[21] Appl. No.: 912,289

[22] Filed: Sep. 29, 1986

[51] Int. Cl.[4] .............................................. G06F 11/00
[52] U.S. Cl. .................................................... 371/61
[58] Field of Search ........................ 371/15, 25, 61; 324/73 R; 307/269; 364/200 MS File, 900 MS File

[56] References Cited

U.S. PATENT DOCUMENTS

| | | | |
|---|---|---|---|
| 3,056,108 | 9/1962 | Heineck | 371/61 |
| 4,081,662 | 3/1978 | Pehrson | 371/61 |
| 4,144,448 | 3/1979 | Pisiotta | 371/61 |
| 4,392,226 | 7/1983 | Cook | 371/61 |
| 4,441,075 | 4/1984 | McMahon | 324/73 |
| 4,542,509 | 9/1985 | Buchanan | 371/61 |
| 4,683,570 | 7/1987 | Bedard | 371/61 X |
| 4,686,677 | 8/1987 | Flora | 371/61 |

Primary Examiner—Jerry Smith
Assistant Examiner—Robert W. Beausoliel
Attorney, Agent, or Firm—Alexander Tognino; Wesley DeBruin

[57] ABSTRACT

A method and apparatus for fault testing a clock distribution network for A.C. and D.C. faults. The fault testing apparatus includes test latch circuit means and is adapted to initially test for D.C. (stuck) faults and to thereafter continuously monitor a plurality of clock signal lines to detect A.C. clock faults.

13 Claims, 5 Drawing Sheets

HIGH PERFORMANCE CLOCK SYSTEM ERROR DETECTION AND FAULT ISOLATION

BACKGROUND OF THE INVENTION

1. Technical Field

This invention relates to testing a data processor, or the like, and more particularly to a method and circuitry for fault testing a clock line, or clock distribution, for various types of faults. The clock error detection method and mechanism in accordance with the invention has particular utility in detecting AC-type faults (missing pulses or spurious pulses) and DC-type stuck-faults. The error detection scheme in accordance with this invention is invoked prior to data processing operations, and once the operations are running, continuously checks for these faults on all clock lines.

2. Background Art

As is well known to persons skilled in the art, a data processor includes numerous complex logic networks for carrying out data processing operations. Interconnecting all the logic networks in a clock distribution network. The clock distribution network is a fan-out network for a clock signal generated by a high frequency crystal oscillator. The clock signal is distributed to all the logic networks in a predetermined timing relationship.

The complexity of the logic and clock distribution networks in a large data processor presents extreme difficulties in the testing environment. Typically, tests are performed on the data processor prior to shipment. Internal tests are also generally performed by the data processor itself each time power it turned on to assure fault-free performance.

Many techniques are known for fault testing the logic network portion of a data processor. For example, one widely known technique for testing a logic network is the Level Sensitive Scan Design (LSSD) technique wherein normally inaccessible logic points on an integrated circuit chip are accessed by means of a shift register latch network. The LSSD technique is described in detail in many publications and patents, for example, U.S. Pat. No. 3,783,254 entitled "Level Sensitive Logic System", granted Jan., 1, 1974 to E. B. Eichelberger, U.S. Pat. No. 4,441,075 entitled "Circuit Arrangement Which Permits The Testing of Each Individual Chip and Interchip Connection in A High Density Packaging Structure Having A Plurality of Interconnected Chips, Without Any Physical Disconnection" granted Apr. 3, 1984 to Maurice McMahon et al, U.S. Pat. No. 4,503,386 entitled "Chip Partitioning Air (CPA) - A Structure For Test Pattern Generation For Large Logic Networks" granted Mar. 5, 1985 to Sumit Das Gupta et al and the publication "A Logic Design Structure For LSI Testability" by E. B. Eichelberger and T. W. Williams, 14 Design Automation Conference Proceedings, June 20, 21 and 22, 1977, New Orleans, La., IEEE Catalog Number 77, CH1216-1C, pages 462-8. The LSSD technique allows the complex logic networks which form a data processor to be fully tested. This technique, however, assumes the clock system does not cause any faults. In real systems, this is not the case.

Each clock signal line in the clock distribution is susceptible to two types of faults. The first is DC-type, or sometimes referred to as stuck-faults. A stuck-fault can manifest itself as stuck-on, which means that the clock signal line is still supplying a clock even though the clock distribution network has been disabled, or a stuck-fault can manifest itself as stuck-off, which means that the clock signal line does not supply a clock although the clock distribution network has been enabled. The second class of faults is AC-type, or sometimes referred to as an intermittent fault. An intermittent fault implies that the fault occurs and then does not occur again. An example of this may be a power surge that causes an extra pulse in the clock distribution, or may cause the clock distribution to miss a pulse. Thus, AC-type fault detection will detect the occurrence of a missing pulse or an extra, "spurious" pulse.

While detection of the fault is of primary importance, of equal importance is the isolation of the fault such that a repair action can take place. In other words, the fault must be isolated so that any removal of parts is minimized to a Field Replaceable Unit (FRU); ideally, the isolation piece will indicate one, and only one, FRU to replace.

The following U.S. patents and publications are directed to clocking systems and more particularly the testing thereof. It is to be appreciated, with reference to the subject invention, that the following art is not submitted to be the only, the best, or the most pertinent prior art.

No. 3,056,108 entitled "Error Checking Circuit" granted Sept. 25, 1962 to A. W. Heineck.

No. 3,350,580 entitled "Monitor Employing Logic Gate and Counter To Indicate Normal Pulse-Train Failure After Predetermined Time Interval" granted Oct. 31, 1967 to J. S. J. Harrison.

No. 3,458,822 entitled "Clock Pulse Failure Detector" granted July 29, 1969 to J. R. Hahn, Jr.

No. 3,795,867 entitled "Pulse Detection Arrangement" granted Mar. 5, 1974 to L. V. Jones, Jr.

No. 3,899,665 entitled "Timing Error Detection Circuit" granted Aug. 12, 1975 to D. E. Gaon.

No. 3,903,474 entitled "Periodic Pulse Check Circuit" granted Sept. 2, 1975 to P. R. Wiley.

No. 4,081,662 entitled "Clock Supervision In Digital Systems" granted Mar. 28, 1978 to J. E. Pehrson et al.

No. 4,122,441 entitled "Error Detection And Indication System For Bi-Phase Encoded Digital Data" granted Oct. 24, 1978 to R. L. Robinson et al.

No. 4,144,448 entitled "Asynchronous Validity Checking System And Method For Monitoring Clock Signals On Separate Electrical Conductors" granted Mar. 13, 1979 to E. C. Pisciotta et al.

No. 4,168,487 entitled "Code Detection Circuit" granted Sept. 18, 1979 to K. Fukuoka et al.

No. 4,362,957 "Clock Pulse Tolerance Verification Circuit" granted Dec. 7, 1982 to D. R. Stern.

No. 4,392,226 entitled "Multiple Source Clock Encoded Communications Error Detection Circuit" granted July 5, 1983 to D. M. Cool.

No. 4,507,784 entitled "Data Processing System" granted Mar. 26, 1985 to B. J. Procter.

No. 4,542,509 entitled "Fault Testing A Clock Distribution Network" granted Sept. 17, 1985 to G. S. Buchanan et al.

IBM Technical Disclosure Bulletin publication entitled "Delay Testing And Diagnosis of LSSD Shift Register Strings" by K. E. Dimitri, Vol. 20, No. 1, June 1977, pages 307-12.

IBM Technical Disclosure Bulletin Publication entitled "Complete Fault Detection and Fault Location For System Oscillator" by E. J. Herceg et al, Vol. 22, No. 1, June 1979, pages 80–1.

IBM Technical Disclosure Bulletin Publication entitled "Anomaly Detection In Overlapping Multiphase Clock" by P. H. James, Vol. 22, No. 2, July 1979, pages 792–3.

IBM Technical Disclosure Bulletin Publication entitled "Clock Running Detector" by P. K. H. Kam, Vol. 22, No. 11, April 1980, pages 4866.

U.S. Pat. No. 4,542,509 discloses an apparatus for fans fault testing the clock distribution network which fans out a clock signal from a system oscillator to a plurality of clock signal lines. The fault testing system includes a test latch which stores a logic value (binary "1" or "0") therein and a decoder for connecting any one of the clock signal lines to the test latch. Also provided is means for storing a first logic value at the input thereof. Means are provided for enabling the clock distribution network to thereby propagate the second logic value through the test latch if the clock signal line under test is operating properly (i.e. it is not stuck-off), and for inhibiting the clock distribution network so that the second logic value will not propagate through the test latch if the clock signal line under test is operating properly (i.e., it is not stuck-on).

SUMMARY OF THE INVENTION

It is a primary object of the invention to provide a method and apparatus for fault testing the clock distribution network of a data processor or the like.

It is an object of the invention to provide a method and apparatus for isolating a fault in a clock distribution network to a particular clock signal line.

It is another object of the invention to provide a method and apparatus for fault testing a clock distribution network utilizing a limited amount of additional simple circuitry and without requiring an external reference clock.

It is a further object of the invention to provide a method and apparatus of fault testing a clock distribution network which detects extra (spurious) pulses, missing pulses and stuck faults.

It is another object of the invention to continuously check for AC-type faults dynamically, i.e., every cycle, while DC-type faults are checked once before starting the data processing operation.

It is still a further object of the invention to provide a method and apparatus for fault testing a clock distribution network which is compatible with known LSSD techniques so that the clock distribution network testing system can be integrated with the logic network fault testing system.

To guarantee that a clock is arriving at the processor network properly, a stuck-fault test is performed at multiple points within the clock distribution network. At various points within the distribution, additional hardware is included to test for a stuck-at-1 (inactive/-off) or a stuck-at-0 (active/on) condition. Note, the "on" and "off" binary definitions are implementation dependent. The actual hardware mechanism utilized is essentially a shift register latch (SRL in an LSSD environment) with the data input tied to a fixed logic level such as binary "1". Under console control, the test procedure is performed. The procedure tests for a stuck-at-0 clock first, then tests for a stuck-at-1 clock. This test is performed for every clock in the clock network up to the interface with the processor network prior to starting data processing operations.

In order to stuck fault test a clock signal line all clocks are first inhibited (placed in their inactive state), and the particular clock under test is gated off from the test SRL. A known value is then scanned into the test SRL, while a known opposite value is applied to the Data In port of the SRL. For example, a binary "0" is scanned in through the Scan Data In port while a binary "1" is applied otothe Data In port. While the clock system is inhibited, the clock line under test is gated on to the test SRL. After some time, the clock to the test SRL is gated off, and the value in the test SRL is scanned out. If the value in the SRL has changed state due to the value of the Data In port propagating into the SRL, in this case from binary "0" to a binary "1", the clock under test must therefore be stuck on. If, however, the data in the SRL is unchanged it can only be ascertained that the clock is not stuck on.

To test for a stuck off clock, the clock is again gated off and a binary "0" is scanned into the test SRL. The clock line is then gated on, and the clock is cycled at least once (one or more pulses are released). The clock is then gated off and the test SRL is scanned out. If the value of the latch has changed state, having eliminated the possibility of a stuck on clock in the first test, it is concluded the clock is operating properly. If, however, the value of the SRL does not change state it is concluded that the clock is stuck off.

A glitch is any unwanted occurrence that is large enough to set a latch improperly and usually happens infrequently and at random. A glitch is not defined to be a stuck fault. The common term for a glitch is an A.C. fault, while the stuck fault is commonly referred to as a D.C. fault. The clock A.C. error detector has been provided, in accordance with the invention, to detect this occurrence. A glitch has the effect of producing two clocks when only one should have occurred (extra pulse), or eliminating a clock when one should have occurred (missing pulse). Either of these occurrences will cause erroneous data to be captured in a latch and the machine will stop due to this error condition. The circuit implementation which detects an A.C. fault is essentially a shift register latch (SRL) including a feedback circuit containing a predetermined delay. The test SRL is preset via a scan operation to a known state, e.g. a binary "1". This sets the detector output and the Data In port at a binary "0". The first occurrence of the system clock (clock under test) will flip the SRL to a binary "0", putting a binary "1" on the output. The next occurrence of the system clock will flip the SRL back to a binary "1", which is its original state. This toggle action will occur each cycle thereafter. The feedback delay of sufficient amount is included such that potential race conditions (implementation dependant) will not cause invalid data to be stored in the test SRL.

Since the fault acts as an extra pulse or missing pulse, the detector circuit will be in the state opposite the "expected state". In the case of the extra pulse, the detector circuit toggled twice, while in the case of the missing pulse, the detector circuit did not toggle. The difference between the expected state and the actual state of the detector indicated a fault has occurred.

The AC- and DC-type fault detection circuits can be integrated into one circuit through a control mechanism to distinguish which test will be performed.

DESCRIPTION OF THE PREFERRED EMBODIMENT

Figure 1:
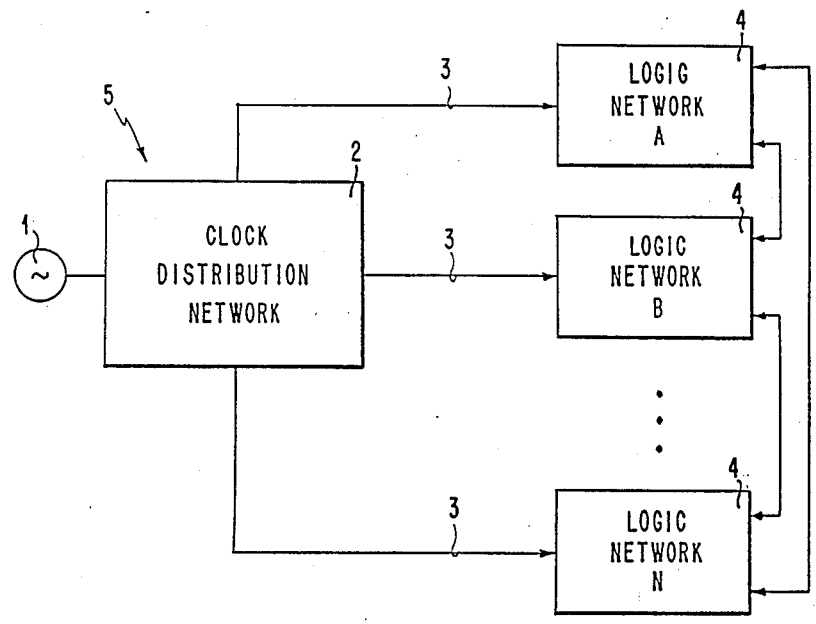
FIG. 1 illustrates a simplified representation of a data processor.

Referring to FIG. 1 there is illustrated a simplified representation of data processor. Data processor 5 includes a plurality of logic networks 4 each of which may include many thousands of logic gates for performing a specific data processing function. The logic network may also contain latches and chip arrays. A large data processor may include hundreds of such logic networks. Clock distribution network 2 is connected to oscillator 1. Clock distribution network 2 distributes clock timing pulses derived from the oscillator signal to each of the logic networks throughout the data processor via clock distribution lines 3.

Figure 2:
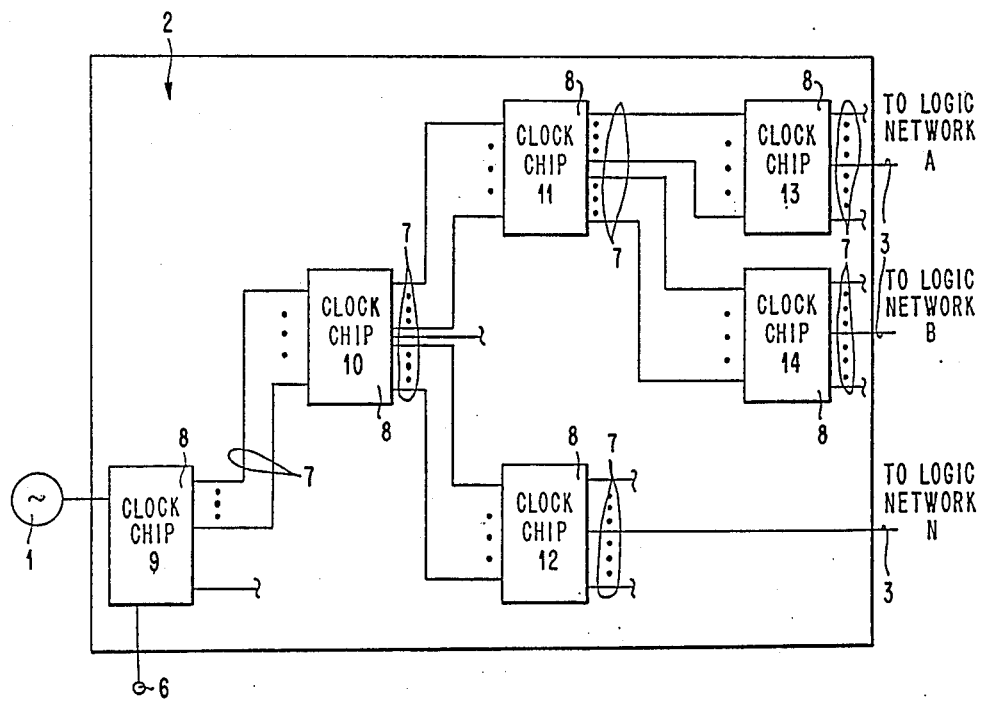
FIG. 2 illustrates a typical clock distribution network in a data processor, including a plurality of clock distribution chips.

FIG. 2 illustrates a more detailed representation of clock distribution network 2. Clock distribution network 2 is a fan-out network from the oscillator 1 to the plurality of clock distribution lines 3. Clock distribution network 2 contains a plurality of clock distribution chips 8. Each clock chip output will hereinafter be referred to as a clock signal line 7. Some of the clock signal lines 7 are internal to clock distribution network 2 (e.g., the clock signal lines 7 which connect clock chip 10 and clock chip 11). On the other hand, some of the clock signal lines 7 form the clock distribution lines 3 which connect clock distribution network 2 to logic network 4 (e.g., the clock signal line 7 which connects clock chip 13 to logic network A). In order to fault test clock distribution network 2 and to isolate a fault to a particular clock signal 7 each clock signal line must be tested for both DC stuck faults (e.g., stuck on or off) and AC faults (e.g., missing pulses or extra pulses).

Figure 3:
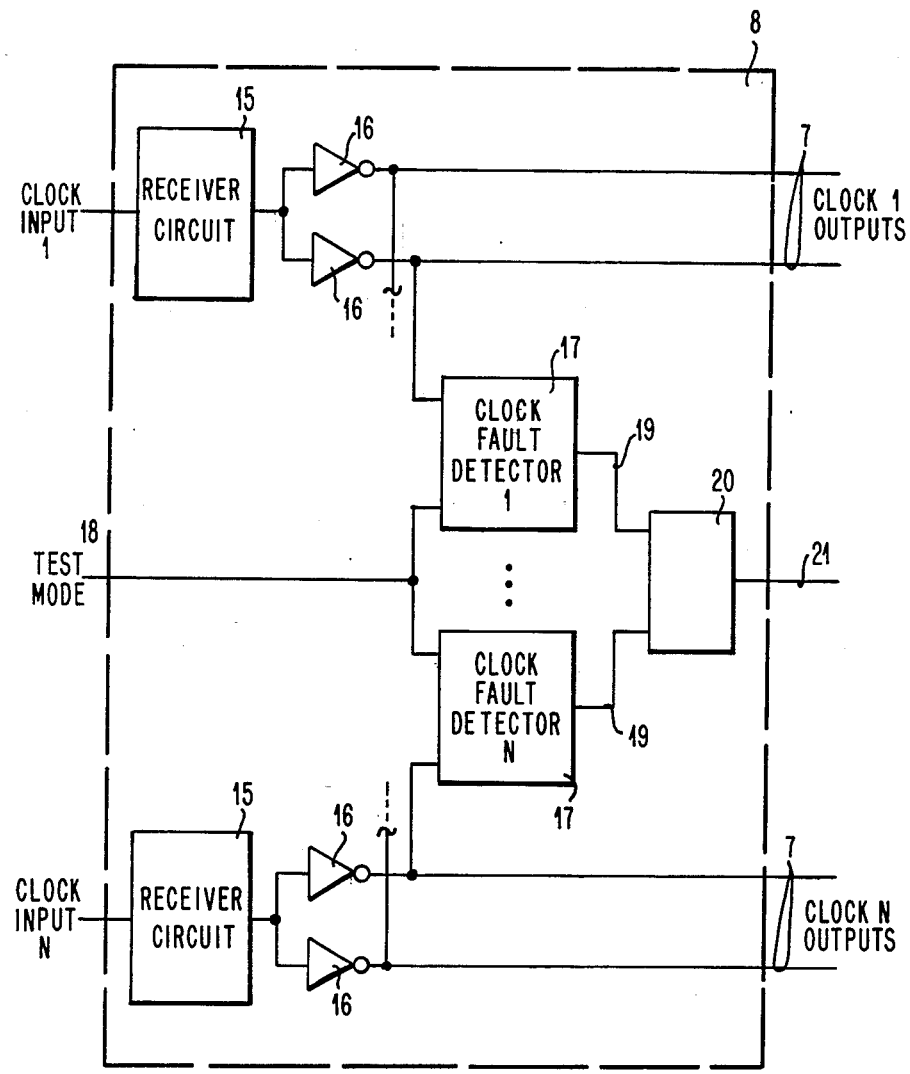
FIG. 3 illustrates a clock distribution chip including clock fault detector circuitry in accordance with the invention.

Referring now to FIG. 3, the details of a clock distribution chip 8 and the manner in which each clock signal line 7 is tested according to the present invention will be described. Clock distribution chip 8 includes a plurality of receivers 15 to which the clock chip inputs are applied, and a plurality of drivers 16 each of which drives a clock signal line 7. As illustrated in FIG. 3 one receiver 15 fans out to two drivers 16. However it will be recognized by those having skill in the art that different fanout arrangements may be employed. It will also be recognized by those having skill in the art, that fault testing can be performed at the output of receivers 15 rather than at the output of drivers 16 as illustrated in FIG. 3. Fault testing at the output of receivers 15 reduces the number of lines to be tested, but also reduces the ability to isolate a fault to a particular clock signal line 7. In accordance with the present invention, each clock signal line 7 of each clock distribution chip 8 will be both DC and AC fault tested by clock fault detector 17. The details of fault testing clock signal line 7 for DC type faults is described below followed by a description on fault testing clock signal line 7 for AC type faults.

Figure 4:
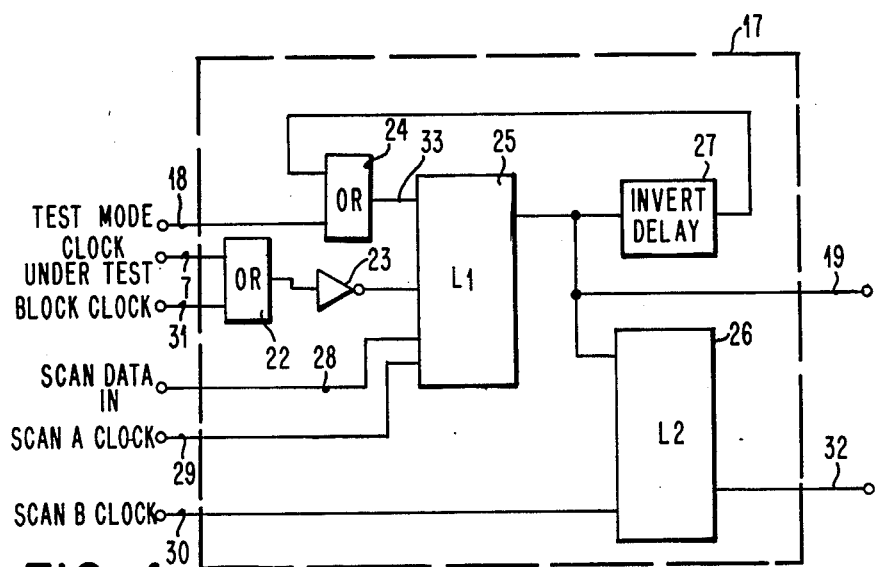
FIG. 4 discloses in a clock fault detector circuit in accordance with the invention.
Figure 4A:
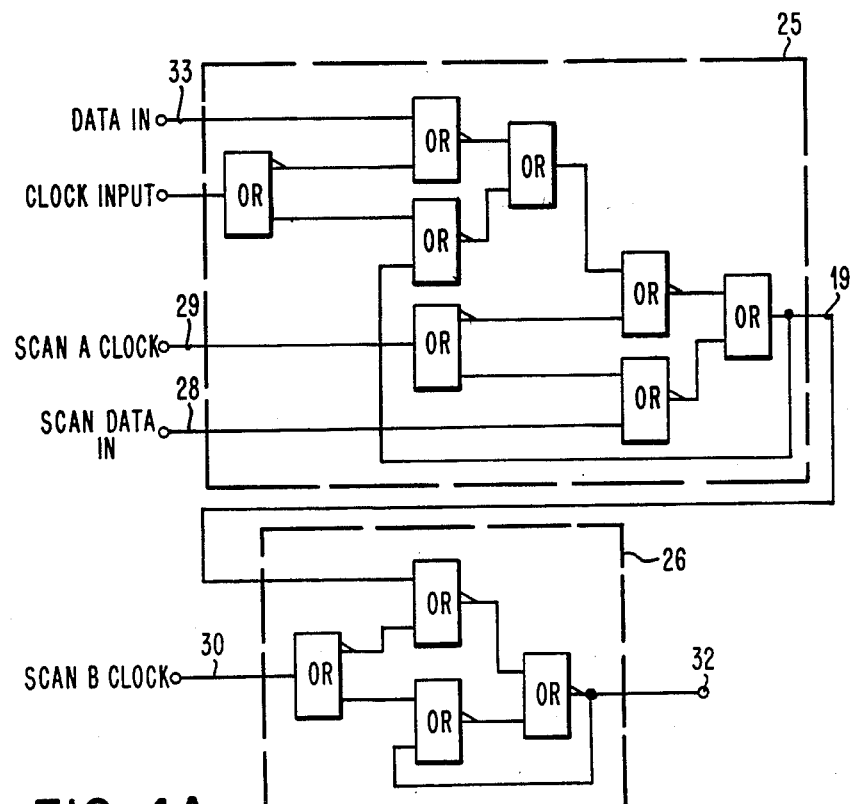
FIG. 4A discloses illustrative logic block diagrams of a master (L1) latch and a slave (L2) latch which may be employed as an SRL to practice applicants invention.

FIG. 4 illustrates a more detailed representation of clock fault detector 17 of FIG. 3. As shown in FIG. 4 a master/slave latch, which includes a master latch 25 and a slave latch 26, is used for testing clock signal line 7. The master/slave latch has the advantage that it can be integrated into a shift register with other master/slave latches in the processor. Master latch 25 includes a scan (shift) 28 (which may be connected to a shift register latch string in the data processor) for providing the binary value to be shifted into the master latch. Scan clock input 29 controls the shifting of binary values into master latch 25. Slave latch 26 includes a latch output 32 for providing the binary value which has shifted through the master/slave latch. Scan clock 30 controls the shifting of binary data through the slave latch 26 is provided by the output 19 of master latch 25.

During fault testing, clocking for the master latch is provided by the clock signal line under test as routed into the output of OR gate 22. The output of OR gate 22 drives master latch clock driver 23. Block clock input 31 is used to preset the setting of master latch 25 during the initialization of the DC fault test as described below. The fault detector circuit of FIG. 4 checks a clock signal line for DC faults as follows:

In order to test for a stuck on clock (clock always running) a first value (e.g. binary ZERO) is shifted into latch 25 via scan (shift) input 28 (controlled by clock input 29) while the clock network 2 is inhibited. The clock network may be inhibited by means of an inhibit input 6 (FIG. 2.) in the first clock chip, i.e., clock chip 9 which directly connects to oscillator 1, although alternate means may be employed. Applying a binary ONE to test mode input 18 causes a second opposite logic value (e.g., binary ONE) to be maintained at the data input 33 of master latch 25. The data input 33 of latch 25 is the output of OR block 24. With the clock network inhibited, the second logic value at data input 33 should not shift into latch 25. However, if the clock signal line under test is stuck-on, the data will shift through the master latch 25 so that the output 19 of master latch 25 will be at the second logic value (i.e., binary ONE). Thus, if the logic value at the data input of master latch 25 propagates through to output 19 even though the clock network is inhibited, it may be ascertained that the clock signal line under test is stuck-on.

The clock signal under test is tested for stuck-off (clock never runs) in a similar manner. A first logic value (e.g., binary ZERO) is stored in master latch 25 while a second logic value (e.g., binary ONE) is maintained at its data input 33. Clock distribution network 2 is enabled, e.g. by a signal on line 6 (FIG. 2). If the second logic value at the data input of master latch 25 propagates to its latch output 19 then the clock signal under test is not stuck-off. However if the second logic value does not propagate through master latch 25 when the clock distribution network is enabled, then the clock signal line under test is concluded to be stuck-off.

Figure 5:
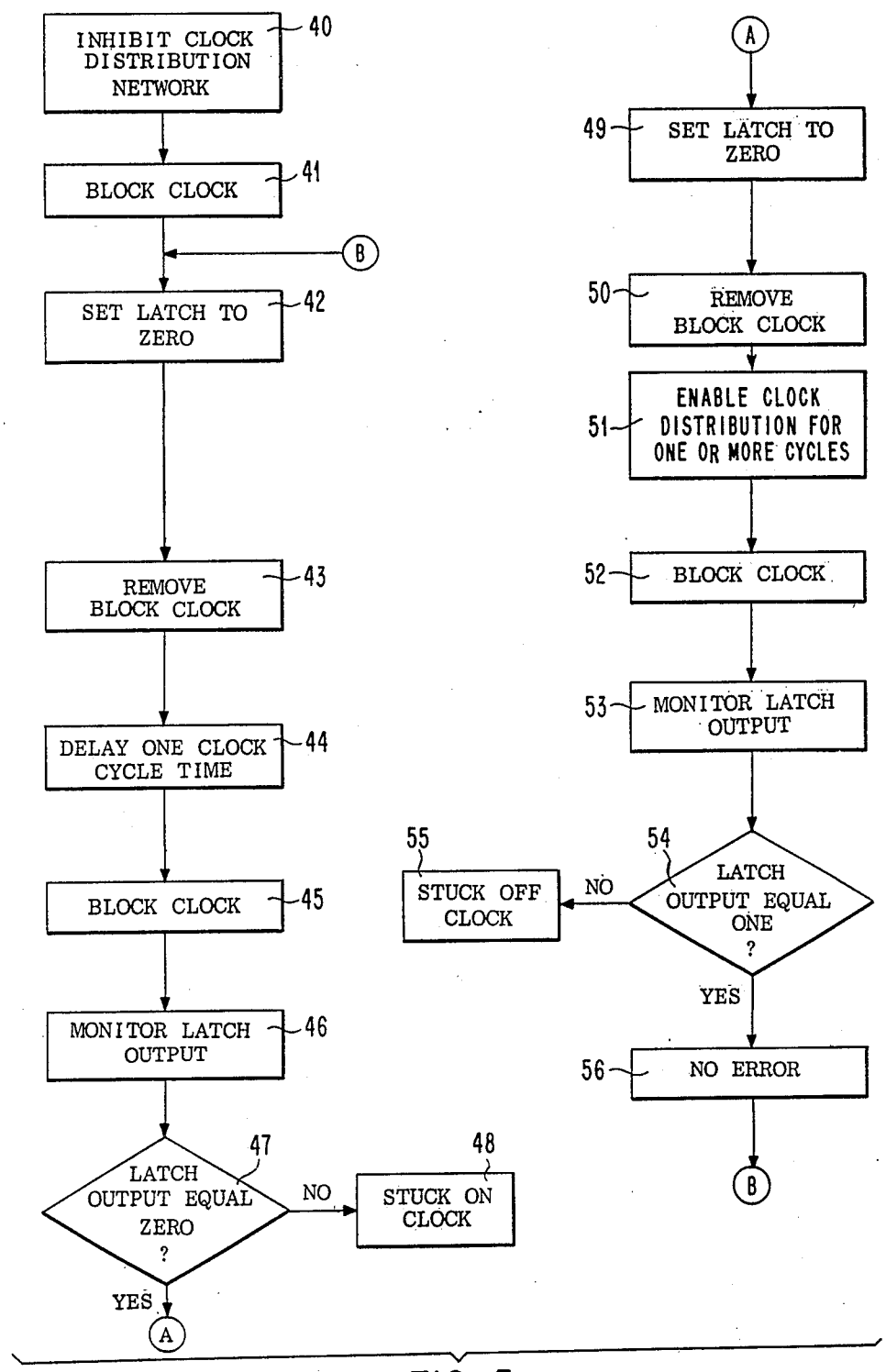
FIG. 5 is a flow chart disclosing a method of D.C. fault testing of clock signal lines according to the present invention.

Referring now to FIG. 5, clock distribution network 2 (FIG. 2) is stuck fault tested as follows: First clock distribution network 2 is inhibited, e.g., by applying (block 40) an inhibit signal to line 6 (FIG. 2). Application of the clock distribution network inhibit signal effectively disconnects the oscillator from the clock distribution network. Then, the block clock signal 31 (FIG. 4) is applied (block 41) so that master latch 25 is not set during the scanning procedure. Then, (block 42) the first logical value (e.g., logic ZERO) is applied to master latch 25 via its scan input 28 under control of scan clock input 29. A second logic value (e.g., binary ONE) is maintained at the data input 33 of master latch 25 by applying a binary ONE to test mode signal 18 (FIG. 4).

The block clock signal 31 is removed (block 43) and the test waits at least one clock cycle time (block 44) before again applying the block clock signal (block 45). The output 19 of master latch 25 is then monitored (block 46). If (block 47) the output is binary ZERO then the clock signal line under test operated properly because a binary ONE did not propagate through the latch when the clock was off. On the other hand, if the latch output is ONE (block 48) then the clock as stuck-on.

Assuming the clock is not stuck-on, a stuck-off test is performed. The latch is again set to logic ZERO (block 49) and the block clock signal is removed (block 50). The test then enables the clock distribution network for at least one cycle (block 51) by removing the clock inhibit signal 6. The clock is then blocked again (block 52) and the output 19 of master latch 25 is monitored (block 53). If the output is ONE (block 54) then there was no error (block 56) because the ONE did propagate through the latch. On the other hand, if the latch still remains at logic ZERO, then the clock is stuck-off (block 55) and there is an error. the test sequence of FIG. 5 allows all the clock lines under test to be tested simultaneously to reduce the test time.

AC Fault Testing

AC faults (e.g., missing pulses or extra pulses) usually happen infrequently and at random. Since these types of faults are generally not reproducible, it is imperative that the detector be active every processor cycle to detect these faults when they occur. The clock fault detector of FIG. 4 tests a clock signal line for AC type faults as follows:

The clock distribution network is inhibited by applying an inhibit signal to line 6 (FIG. 2). Block clock signal 31 is not applied during the AC fault test. The first value (e.g., logic ZERO) is applied to master latch 25 via its scan input 28 under controls of scan clock input 29. A logic ZERO is then applied to test mode signal 18. This completes the feedback path from the output 19 of master latch 25 through the inverting delay block 27 to the data input 33 of master latch 25. Thus the inverting feedback path causes a second logic value, (e.g., logic ONE) opposite to the first logic value, to be applied to the data input 33 of master latch 25. This initialization process is completed on all clock fault detectors 17 of FIG. 3.

The data processor now removes the inhibit signal from line 6. This allows the clock pulses to propagate through the clock distribution network 2 via clock signals 7. The first occurrence of the clock on clock signal line under test 7 will cause all the master latches 25 to change state and store the second logic value (e.g. logic ONE). Thus the detectors output 19 all change to logic value ONE and after this signal propagates through the inverting feedback 27, the data input 33 of the master latch 25 will have the opposite logic value. In order to prevent race conditions within an LSSD environment, a delay element (technology dependent) of sufficient time is required between the output and input of said latch. The next occurrence of the clock under test will flip the master latch 25 back to its original state. Thus under fault free clock operation master latch 25 will toggle every cycle between logic ZERO and logic ONE.

Referring now to FIG. 3, each of the N clock fault detectors outputs 19 are fed to an ERROR COLLECTING logic network 20. The ERROR COLLECTING logic detects the presence of a fault by determining if one of the N fault detector outputs 19 is in the opposite state of the remaining N−1 fault detector outputs. For example, but not limited to, an EXCLUSIVE OR network of an even number of inputs would have the necessary characteristic for this ERROR COLLECTING logic. Since all clock fault detectors were initialized to the same binary value and, under fault free conditions, all clock fault detectors will toggle together, the output of the ERROR COLLECTING network 21 should always indicate no error. If one of the N clock lines under test has a missing clock pulse for a cycle it will not toggle its corresponding master latch 25. Thus the faulty detector output 19 will be in the opposite state of the remaining N−1 clock fault detectors. Thus signal line 21 will indicate a clock error. Likewise if one of the N clock lines under test has an extra pulse during a cycle, its detector output 19 will be out of sequence with the remaining N−1 clock detectors. Again this will cause signal 21 to indicate a clock error.

Figure 6:
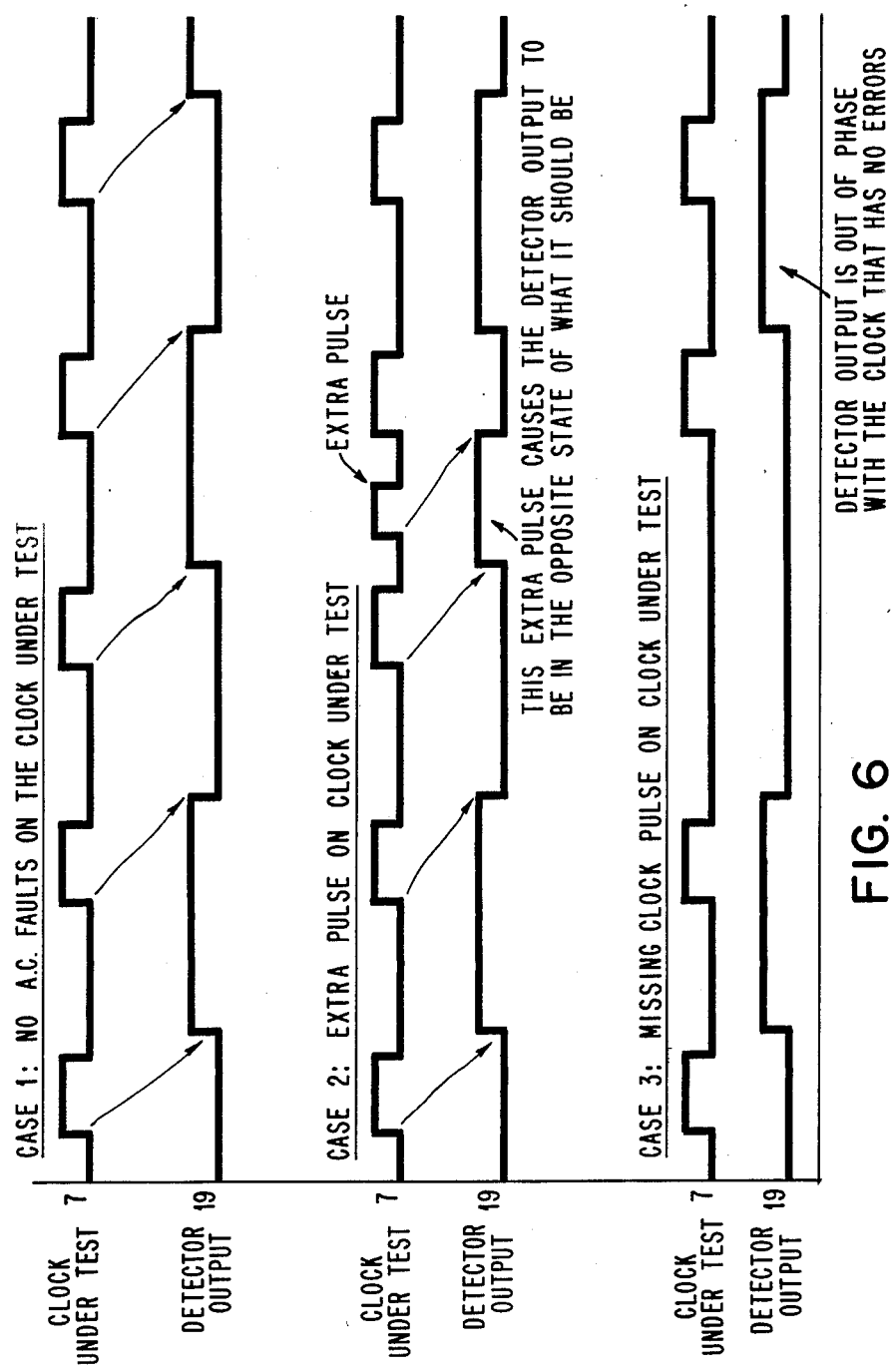
FIG. 6 depicts a plurality of clock waveforms to be viewed in conjunction with the explanation of clock error detection circuitry in accordance with the invention.

FIG. 6 shows a timing diagram for the three possible A.C. cases that a clock line under test can experience. Case 1 shows the detector output when the clock under test has no AC faults. Note that the detector output toggles every cycle. Case 2 shows the detector output when an extra clock pulse occurs in a cycle. Note that after the occurrence of the extra pulse, the detector output is in the opposite state of the detector output for the fault free case, i.e., case 1. Finally case 3 shows the detector output when there is a missing pulse for one cycle. Again the detector output is in the opposite state of the detector output for the fault free case. In each of these cases the ERROR COLLECTING network 20 will indicate whether a fault has occurred.

Whereas we have illustrated and described the preferred embodiment of the invention, it is to be understood that we do not limit ourselves to the precise construction herein disclosed and the right is reserved to all changes and modifications coming with the scope of the invention as defined by the appended claim.

What we claim is:

1. Apparatus for fault testing a clock distribution network which fans out a single-ended clock signal to a plurality of clock signal lines with said apparatus fault testing each of said plurality of clock signal lines for the presence of stuck-at-faults and missing and extra pulses, said apparatus including:
   (a) a clock fault detection circuit for each of said plurality of said single-ended clock signal lines, said clock fault detection circuit having a first latch circuit means, said first latch circuit means having a data-in-port, a scan data-in-port with a predetermined one of said plurality of clock signal lines connected to said data-in-port and an output;
   (b) invert delay circuit means, said invert delay circuit means having an input connected to said output of said first latch circuit and an output connected to the data-in-port of said first latch circuit means; and (c) an error collecting means, said error collecting means having a plurality of inputs, each of said plurality of inputs of said error collecting means connected to the output of a discrete one of said first latch circuits of said plurality of clock fault detector circuits, said error collecting means having an output for rendering an error signal if any one or more of said clock signals malfunctions.

2. Apparatus for fault testing a clock distribution network, as recited in claim 1, wherein said error collecting means renders a first output signal if said clock signals on said clock signal lines are all in proper time relationship one to another, and a second output signal if said clock signals on said clock signal lines are not all in proper time relationship one to another.

3. Apparatus for fault testing a clock distribution network as recited in claim 2 wherein said error detection means is an exclusive OR logic gate.

4. Apparatus for fault testing a clock distribution network as recited in claim 1 wherein said clock fault detector circuit for each of said plurality of clock signal lines, comprises:

a first OR circuit having a first input, a second input and an output, said first input of said first OR circuit being the test mode input of said clock fault detector circuit, said second input of said first OR circuit connected to the output of the invert delay circuit means, a second OR circuit having a first input, a second input and an output, said first input of said second OR circuit being the clock under test input of said clock fault detector circuit, said second input of said second OR circuit being the block clock input of said second OR circuit, a first latch circuit, said first latch circuit having a data-in-port, a scan data-in-port and an output, said data-in-port having a data input connected to said output of said first OR circuit and a clock input connected to said output of said second OR circuit, said scan data-in-port having a scan data input and a scan clock input, and an invert delay circuit having an input connected to said output of said first latch circuit and an output connected to said second input of said first OR circuit, said invert delay circuit inverting and time delaying the output of said first latch circuit.

5. Apparatus for fault testing a clock distribution network, as recited in claim 4, wherein each of said clock fault detectors further includes a second latch (L2) circuit, said second latch circuit having a scan data in port and an output, said scan data in port having a scan data input connected to said output of said first latch (L1) circuit and scan B clock input.

6. Apparatus for fault testing a clock distribution network as claimed in claim 5, wherein said first (L1) and second (L2) latch circuits form a shift register latch (SRL) and said shift register latches of said plurality of clock fault detector are interconnected into a shift register.

7. Apparatus for fault testing a clock distribution network as recited in claim 6 wherein said second latch circuit has an input connected to the output of said first latch, a scan clock input and an output for providing the binary value which has shifted through said first and second latch.

8. Apparatus for fault testing a clock distribution system as recited in claim 5 wherein the stuck at fault is detected by first inhibiting all clocks and gating off a specific clock under test from the first and second latches, and then scanning a first binary value into the first latch means while applying a known opposite binary value to the data-in-port.

9. Apparatus for fault testing a clock distribution system as recited in claim 8 wherein the stuck at fault is a stuck-on clock fault and the binary output value of the second latch is the value of the data-in-port.

10. Apparatus for fault testing a clock distribution system as recited in claim 8 wherein the stuck at fault is a stuck-off clock fault and the binary output value of the second latch is the value scanned into the first latch means.

11. Apparatus for fault testing a clock distribution system as recited in claim 5 wherein the missing and extra pulses are detected by presetting the first and second latches to a binary value which binary value output is inverted by inverter circuit means and returned to data-in-port of the first latch means.

12. Apparatus for fault testing a clock distribution system as recited in claim 11 wherein the binary value of the detector circuit is opposite to an expected state.

13. Apparatus for fault testing a clock distribution network as recited in claim 4 wherein there is a time delay from the invert delay circuit means to the first latch means which delay is greater than the pulse width of the clock under test.

* * * * *